(12) United States Patent
Hjort

(10) Patent No.: US 9,781,860 B2
(45) Date of Patent: Oct. 3, 2017

(54) COOLING METHOD FOR DEVICES GENERATING WASTE HEAT

(71) Applicant: Danfoss Solar Inverters A/S, Soenderborg (DK)

(72) Inventor: Thomas Hjort, Vejle (DK)

(73) Assignee: Danfoss Power Electronics A/S, Graasten (DK)

( * ) Notice: Subject to any disclaimer, the term of this patent is extended or adjusted under 35 U.S.C. 154(b) by 385 days.

(21) Appl. No.: 14/368,003

(22) PCT Filed: Dec. 8, 2012

(86) PCT No.: PCT/DK2012/000131
§ 371 (c)(1),
(2) Date: Jun. 23, 2014

(87) PCT Pub. No.: WO2013/097849
PCT Pub. Date: Jul. 4, 2013

(65) Prior Publication Data
US 2014/0345846 A1    Nov. 27, 2014

(30) Foreign Application Priority Data
Dec. 30, 2011   (DK) ................................ 2011 01014

(51) Int. Cl.
*F24F 11/06*    (2006.01)
*H05K 7/20*     (2006.01)
*F28F 27/00*    (2006.01)

(52) U.S. Cl.
CPC ............... *H05K 7/20* (2013.01); *F28F 27/00* (2013.01); *H05K 7/20209* (2013.01); *H05K 7/20945* (2013.01)

(58) Field of Classification Search
CPC .. H05K 7/20; H05K 7/20209; H05K 7/20945; F28F 27/00
See application file for complete search history.

(56) References Cited

U.S. PATENT DOCUMENTS

| | | | | |
|---|---|---|---|---|
| 5,764,506 A | * | 6/1998 | Eynaud | G06F 1/206 236/DIG. 8 |
| 6,191,546 B1 | | 2/2001 | Bausch et al. | |
| 7,562,537 B2 | * | 7/2009 | Liebenow | G01K 13/00 62/125 |
| 2005/0168180 A1 | * | 8/2005 | Minekawa | H01M 10/613 318/268 |

(Continued)

FOREIGN PATENT DOCUMENTS

| | | |
|---|---|---|
| EP | 0 701 279 A1 | 3/1996 |
| EP | 0 821 468 A2 | 1/1998 |
| WO | 2010/056777 A1 | 5/2010 |

OTHER PUBLICATIONS

International Search Report for PCT Serical No. PCT/DK2012/000131 dated Mar. 19, 2013.

(Continued)

*Primary Examiner* — Ljiljana Ciric
(74) *Attorney, Agent, or Firm* — McCormick, Paulding & Huber LLP

(57) ABSTRACT

A method (19) of cooling a heat generating device (2) where the cooling rate (17, 18) of the heat generating device (2) is determined using the rate of change of the temperature (16) of the heat generating device (2).

12 Claims, 2 Drawing Sheets

(56) References Cited

U.S. PATENT DOCUMENTS

| | | | |
|---|---|---|---|
| 2005/0273208 A1* | 12/2005 | Yazawa | G01K 7/425 |
| | | | 700/299 |
| 2007/0076372 A1 | 4/2007 | Lin | |
| 2007/0297893 A1 | 12/2007 | Alon et al. | |
| 2010/0060328 A1 | 3/2010 | Ingman et al. | |
| 2010/0290184 A1 | 11/2010 | Tani | |
| 2011/0220341 A1* | 9/2011 | Kidwell | F24J 3/082 |
| | | | 165/200 |
| 2014/0060794 A1* | 3/2014 | Ishii | F28D 20/02 |
| | | | 165/201 |
| 2014/0075976 A1* | 3/2014 | Glugla | F02B 29/0418 |
| | | | 62/150 |
| 2014/0298839 A1* | 10/2014 | Nagamatsu | H05K 7/20745 |
| | | | 62/186 |
| 2014/0332195 A1* | 11/2014 | Liberman | G05D 23/1917 |
| | | | 165/267 |
| 2016/0135333 A1* | 5/2016 | Lovicott | H05K 7/20209 |
| | | | 361/679.48 |
| 2016/0183408 A1* | 6/2016 | Sutherland | F25D 17/02 |
| | | | 62/93 |

OTHER PUBLICATIONS

Danish Search Report Serial No. PA201101014 dated Oct. 30, 2012.
Communication Pursuant to European Patent Application No. 12 812 825.3-1808 dated Jun. 9, 2017.

\* cited by examiner

COOLING METHOD FOR DEVICES GENERATING WASTE HEAT

CROSS REFERENCE TO RELATED APPLICATIONS

This application is entitled to the benefit of and incorporates by reference subject matter disclosed in International Patent Application No. PCT/DK2012/000131 filed on Dec. 8, 2012 and Danish Patent Application PA 2011 01014 filed Dec. 30, 2012.

FIELD OF THE INVENTION

The invention relates to a method of cooling a heat generating device, in which the cooling rate of the heat generating device is controlled. The invention further relates to a cooling system, for cooling a heat generating device, comprising at least one cooling means and at least one controlling means.

BACKGROUND

In a variety of technical fields it frequently occurs that heat is generated at a certain point and has to be transferred to another point. This is not only the case if heat is generated on purpose (for example for heating purposes), but also if heat is only generated as some kind of a by-product. In the latter case, one typically talks about the generation of waste heat.

A particular example of such a generation of waste heat occurs in the field of electronics and illumination systems (in particular in the case of power electronics and illuminating systems, using LEDs (light emitting diodes)). Here, it frequently occurs that a substantial amount of thermal energy is generated in a comparatively small volume. Furthermore, in particular in case of semiconductors and LEDs, the generated waste heat can only be removed through very small interfaces, for example on only one side of a component, since, for example, the light generated by a LED is supposed to be emitted into a dihedral angle that is as large as possible. In other words, the waste heat power density is quite high and the thermal fluxes that have to be managed can be substantial, as well.

To make things worse, in particular in the field of semiconductors and LEDs, the electronic components are very sensitive to overheating. As an example, if a power LED is operated at a temperature above 65° C. (approximately), its lifetime will substantially degrade. This is also known as the Arrhenius Exponential Law, suggesting that if the temperature is raised by 10° C., a given chemical reaction will proceed approximately twice as fast. Regarding electronic components, this will result in a rule of thumb saying that for every 10° C. increase in temperature, the risk of failure for the respective electronic component doubles.

Therefore, it is a standard move to provide systems that are generating waste heat with a cooling system that is intended to keep the temperature as low as possible with the underlying aim to prolong the lifetime of the electronic components and hence of the resulting device.

However, this necessitates a cooling system that is designed sufficiently large, keeping in mind that cooling systems normally become more effective if the tolerated temperature level of the heat generating device is higher since as a consequence the resulting temperature difference to the ambient temperature becomes larger. Therefore, to be able to lower the internal temperatures, one has to use a cooling system that has a disproportionately larger dimension and is hence more expensive.

The problem of dimensioning a cooling system is particularly dominant, if the amount of waste energy that is generated is not constant and shows only some comparatively large peaks within a base load of generated waste heat. To be able to maintain the temperature at a constant level in such a case, one has to design the cooling capacity of the cooling system according to the waste-heat peaks, which will result in a disproportionately dimensioned cooling system and hence in disproportionately high cost.

It has been already proposed in the state-of-the-art to allow some temperature fluctuations in such a case. Even if the lifetime of the electronic components is shortened by a certain amount due to the increased temperature level, the total cost over a certain time span can still be lower, since the cost for the cooling system can be disproportionately lower. In such a case, the cooling system runs at maximum load if a waste heat-peak occurs. Since the cooling system is "under-dimensioned" with respect to the waste heat generated during such a peak, the temperature of the electronic component will increase (slightly) and decrease once again after the waste heat-peak is over and hence the generated waste heat is lower than the maximum cooling rate of the arrangement again.

Unfortunately, this approach gives rise to yet another problem. In particular in power electronics, typically a variety of different parts with different thermal expansion coefficients are fixedly connected to each other (for example a flat pack chip or ball grid array chip that is soldered to a certain substrate). Therefore, temperature changes will result in a varying mechanical load. If such a thermal stress cycle is repeated very often, this will typically result in a mechanical damage or failure of the parts involved (for example solder points, the chip or the substrate). Of course, such a damage is highly undesired as well.

Studies have shown that by reducing the quantity and/or magnitude of the temperature swings experienced by the individual electronic components of an electronic assembly, it is possible to reduce the thermal stresses on the components and thus increase the lifetime of the system, even if this reduction of temperature swings is at the expense of a slightly increased average temperature.

SUMMARY

It is therefore the object of the invention to suggest a method of cooling a heat generating device that is improved over methods that are known in the state-of-the-art. Another object of the invention is to suggest a cooling system for cooling a heat generating device that is improved over presently known cooling systems according to the state-of-the-art.

The presently suggested method and the presently suggested cooling system solve the object of the invention.

It is suggested to perform a method of cooling a heat generating device in a way that the cooling rate of said heat generating device is determined, at least in part and/or at least at times, based on the rate of change of temperature of said heat generating device. The heat generating device (wherein the expression envisages a plurality of heat generating devices as well) can be essentially every device that is generating heat on purpose and/or as a side effect. The generation of (intended) heat can be performed by an electric heater, a burner or the like. The generation of heat as a side effect (i.e. the generation of waste heat) can occur with mechanical bearings (due to friction), with brakes (also due to friction), with resistors, with electric coils, with power switching devices (for example transistors, thyristors, DIACs, TRIACs, IGBTs, integrated circuits or the like). The method is particularly advantageous, if (parts of the) heat generating device(s) are very sensitive to elevated temperatures and/or if the respective devices are arranged together with temperature sensitive devices (for example if the components are attached to each other, are arranged in a common casing and/or the like). As the cooling rate, one has to normally think of the rate at which thermal energy is extracted. In particular, this can be understood as a thermal flux (which can be provided by convective heat transfer, thermal conductivity and/or heat radiation). As an example, the cooling rate can be varied by opening or closing air ducts, changing the speed of an air fan, changing the speed of a fluid pump, pumping fluid through a fluid-cooled system or the like. Of course, it is possible that the actual temperature of the heat generating device and/or the ambient temperature (and/or other parameters) have an influence on the cooling rate as well. The temperature on which the rate of change of temperature is based may be based on an actual physical measurement of the temperature of the heat generating device (by, for example the use of a temperature measuring device placed on or near the heat generating device) or by, for example, modelling the temperature change in the system and thus calculating the temperature of the heat generating device based on other parameters such as the current through one or more devices, the time, one or more power measurements, the ambient temperature, the cooling rate etc. Alternatively or additionally, the internal structures of the heat generating device may be thermally modelled so that from measurements of temperature at one point, the rate of change of temperature of a critical interface may be calculated. As the rate of change of temperature, normally the change of temperature of the heat generating device per unit time is meant. To avoid fluctuations and/or unnecessary cycles of the cooling system, the feedback of the (measured) rate of change of temperature can be dampened (for example by providing some averaging over a certain time constant). The exact way on how to perform the dampening is, however, optional and can be chosen from the state-of-the-art, as desired. The dependence of the cooling rate on the rate of change of temperature can be chosen in a variety of ways. Some preferred suggestions will be made in the following. Furthermore, the connection between cooling rate and rate of change of temperature can be influenced by additional parameters as well, which will also be further explained in the following. The way how to realise the connection between the cooling rate and the rate of change of temperature can be done in essentially any way, as well. In particular, electronic circuitry can be used for this (including analogue circuitry). Usually, however, it is preferred if a digital calculating unit is used for this purpose. This cannot only be a computer device, but preferably a single board electronic controller as well. The electronic controller can be used solely for the method of cooling or can take over additional tasks, as desired. A particular advantage of the presently suggested method is the direct influence on the cooling rate and hence the possibility to control the rate of change of temperature of the heat generating device in a desired way. In particular it is possible to use a certain limit for the rate of change of temperature to limit the mechanical forces occurring due to different materials in a compound device. Although one has to admit that the thermal expansion coefficient of certain materials cannot be changed, one has to note that different materials also have a different thermal conductivity coefficient (and even if the thermal conductivity coefficient would be the same, different thermal delays can occur due to the size and design of the work piece in question), so that by lowering a rate of change of temperature (for example), usually a lower mechanical stress can be achieved. Of course, the situation can occur that the rate of change of temperature is sometimes not (completely) controllable by the suggested method. This situation can occur if the generated waste heat is higher as compared to the maximum cooling rate achievable. In such a case, the rate of increase in temperature can only be limited to a certain rate (as determined by the maximum cooling rate) or can be set in a way that it is even higher than the minimum rate of increase in temperature that is possible (by reducing the cooling rate). In any case, the method is usually employed in a way that the resulting temperature of the heat generating device is kept as low as possible (wherein a certain lower limit may exist as well).

A preferred embodiment of the method of cooling a heat generating device can be realised if the cooling rate of said heat generating device is determined, at least in part and/or at least at times, based on the temperature of said heat generating device. This way, special temperature limits can be employed, both to the upper side, as well as to the lower side. As an example, if a certain temperature is reached that is particularly destructive or wearing to certain components, it is possible that the cooling rate is set to a maximum rate, independent of the rate of change of temperature. This way, the time that is spent in this damaging/wearing temperature range can be minimised. It is even possible to reduce the amount of generated heat at a certain point by switching off some or all of the components that are producing waste heat or by reducing the power of the respective components (for example by reducing the clock rate for a computer or digital controller). Is it even possible to envisage a low temperature limit, so that a certain minimum operating temperature can usually be guaranteed or at least usually be promoted. This way, unnecessary wear and/or damage to some components can be avoided as well. Of course, it is not only possible to use such temperature limits at the very extremes of the permitted temperature interval. Instead, some additional values can be defined as well, in which the cooling rate is set to a higher and/or lower level (not necessarily maximum level and/or switching off) if the respective temperature is reached.

It is particularly preferred, if the method is performed in a way that the cooling rate is determined, at least in part and/or at least at times, based on the direction of the rate of change of temperature. Usually, it is desired to set the temperature to a comparatively low temperature and not to allow any temperature fluctuations. However, due to limitations of the cooling system, sometimes a temperature increase cannot be avoided. If the temperature of the components increases, it is usually preferred to maximise the cooling rate and hence to avoid temperature changes to the maximum extent possible (as well as keeping the temperature of the components as low as possible). If, however, the temperature of the components decreases when the maximised cooling rate is applied, it is typically preferred, in order to extend the lifetime of the components, to "delay" the temperature decrease by reducing the cooling rate, thus reducing the rate of change of temperature. This reduces further mechanical stresses to the components and so extends their lifetime. Of course, a good compromise between a low temperature and a low rate of change of temperature should normally be chosen. Such a compromise can (additionally) depend on the particular components involved.

Preferably, when performing the method, the cooling rate is chosen in a way that the rate of change of temperature of said heat generating device is limited to a predetermined value, in particular when the temperature of the heat generating device decreases. This way, it is usually possible to prolong the lifetime of the arrangement even further. This can be done by considering and balancing both adverse effects, i.e. by considering and balancing wear of the components due to elevated temperatures and due to mechanical stresses at the same time. The predetermined value cannot only be a single value. Instead, it is possible that the predetermined value can depend on the temperature of the heat generating devices (and presumably to other parameters) as well. This connection can be employed in discrete steps (for example by using a lookup table) and/or by analytical functions. Typical numbers for a limiting value for the rate of change of temperature are 20° C./h, 10° C./h, 5° C./h, 2° C./h, 1° C./h, 0.5° C./h and/or 0.25° C./h.

Furthermore, it is preferred if the cooling rate is elevated, preferably maximised, if the temperature of the heat generating device increases and/or if the temperature is above a certain maximum desired threshold level. This way, temperature fluctuations can usually be avoided to the maximum extent possible. In particular, if the temperature is above a certain maximum desired temperature level, the cooling rate can be elevated (or maximised), even if the temperature is decreasing. Once again, it is possible to provide a variety of threshold levels (for example by using a lookup table and/or by using an analytical function).

Preferably, the method is performed in a way that the cooling rate is chosen in a way that the temperature of the heat generating device follows, at least at times, a monotonic function, preferably a strictly monotonic function, even more preferred and appropriately linear function and/or in that a predetermined minimum cooling rate is sustained and/or in that, at least at times, the extracted heat flow is kept essentially constant and/or in that, at least at times, a cooling device is activated at an essentially constant level. First experiments have shown that such a mode of operation is particularly useful. In particular, the suggested behaviour can be realised for certain time spans and/or for certain temperature ranges.

Another preferred embodiment of the method can be achieved if the cooling rate, in particular the predetermined limited value of the rate of change of temperature, is influenced by auxiliary circumstances, in particular by the previous history of the temperature of the heat generating device and/or by the expected future heat generation rate and/or by the actual time and/or by a system specific setting and/or by a user input setting. This way, the lifetime of the system can be enhanced and/or a particularly high level of comfort for the users can be achieved. As an example, if the previous history of the temperature of the heat generating device shows that after a waste heat-peak, the generated waste heat is usually quite low (in particularly lower than the maximum cooling rate) for an elongated time span, the method can be adapted (in particular, automatically) in a way that the rate of change of temperature is set to a very low level. This is somehow connected to an embodiment where the expected future heat generation rate has an influence on the limiting value. In particular, if (parts of the) heat generating devices are switched off (resulting temporarily in an accordingly low or no heat generation rate), the (active) cooling rate can be set to a particularly low level or even to zero. Then, cooling is only performed by residual thermal conductivity effects, for example. This way, energy can be saved and wear of the components can be reduced.

Another advantage can be achieved by looking at the previous history of the temperature, if a model is used, taking into consideration condensation effects. Therefore, it can be advantageous to reduce the cooling rate and to allow a higher temperature, if a condensation of humidity on certain components can be avoided by this (which is usually more destructive compared to a somewhat elevated temperature). If the current time is considered, it is possible, for example, that a high cooling rate can be avoided at night (and/or at other noise-sensitive times), as an example. One has to keep in mind, that the high cooling rate is usually connected with an elevated noise level which is usually annoying to persons, particularly during the night (or times, when a low ambient noise level is present). A system specific setting can be made according to the particular components involved and can be made in the factory or at installation time, as an example. A user input setting can be advantageous, if the user wants to avoid a high noise level at certain times or the like.

Another preferred embodiment of the method can be achieved if the cooling rate is determined by the estimated temperature, or variation of temperature, of a particular thermal interface, wherein the estimate is derived through computation based on the measurement of the temperature of said heat generating device combined with the operating state of the device and a thermal model of the interface structure of the device. By the term thermal interface is to be understood the interface between materials that heat encounters in passing from the body in which it is generated (for example a semiconductor component) to the cooling system. Failures can occur at such interfaces due to cyclic stresses, and it is an advantage to reduce stresses from thermal variation at specific (critical) interfaces. It is thus an advantage to measure, or calculate, the temperatures or temperature variations at those interfaces. In many cases this is simply not possible to measure directly, since such interfaces are inaccessible. However, the method may be used to derive the temperature at a specific interface by measure the temperature, or other parameters, at one location, and from that measurement combined with the operating state of the device and a thermal model of the interface structure of the device, the temperature (or variation of temperature) of the thermal interface of interest through computation may be derived. The internal structures of the heat generating device may be thermally modelled so that from measurements of temperature at one point, the rate of change of temperature of a critical interface may be calculated. Any number of measurements could be added to increase accuracy of the calculated temperature.

Yet another preferred embodiment of the method can be achieved, in particular in the situation where there are a plurality of thermal interfaces within the heat generating device, whereby separate estimates may be made for each of the thermal interfaces and the cooling rate may be determined by the estimated temperature, or variation of temperature, of the thermal interface that is most critical to the reliability of the heat generating device. Not all thermal interfaces may be critical for reliability, and some thermal interfaces may be critical in some circumstances and not in others. The choice of which estimate to use to determine the cooling rate can be taken based on parameters such as historical temperature measurements or the estimated temperature cycling on each thermal interface.

Preferably, the method is performed in a way that at least at times no active cooling is performed of the generating device, in particular if the temperature is below a certain cut-off threshold level. No active cooling can be understood as a complete switching-off of the cooling devices (because usually still some heat conductivity effects are remaining, for example). This way, energy can be saved and the noise level can be lowered.

Another preferred embodiment of the method can be achieved if at least one cooling inhibiting device and/or at least one cooling inhibiting mode is provided. In particular, a cooling inhibiting device can be a flap or a shutter that closes (a major part) of an air vent, for example. However a cooling inhibiting device (and/or a cooling inhibiting mode) can be taken from a much broader range. As an example, it is even possible to operate an air fan in a slowly revolving reversed mode, such that a chimney effect of an air vent (if present) will be counteracted by the revolving air fan. This way, the rate of change of temperature can be lowered even further. Therefore, the corresponding advantages can be achieved.

Yet another preferred embodiment of the method can be achieved if, at least at times, a heating process is performed, in particular if the temperature of the heat generating device is below a certain minimum temperature threshold level. This way, a damaging or wearing low temperature interval can be avoided. This way, another possibility to prolong lifetime of the components can be achieved. This embodiment can also play an effect if condensation effects have to be avoided. An embodiment for this can be achieved by providing a heating device and/or a heating mode.

Furthermore, a cooling system, comprising at least one cooling means and at least one controlling means, is suggested, wherein the cooling system, preferably said at least one controlling means, is designed and arranged in a way that it performs a method according to the previous suggestions. In particular, the cooling system can be used as a separate arrangement that is connected later on (presumably even as a retro-fitted solution) to heat generating devices. However, it is also possible, that the cooling system and the heat generating devices are used as some kind of a compound system. In any case, the cooling system can show the same advantages and effects, as already described, at least by analogy. Furthermore, the cooling system can be modified in the previously suggested sense as well, at least by analogy. This can result, of course, in the previously described advantages and effects as well, at least by analogy.

In particular, it is suggested to provide the cooling system with at least one pumping device and/or at least one convective heat transfer device. The pumping device can be used for gases, liquids, mixtures of gases and liquids or even for hypercritical fluids. Of course, is usually not problematic if the fluid contains a certain amount of solid particles. As a convective heat transfer device, usually a heat transfer device is meant that transfers heat to a medium that is moving. In particular, this medium can be a liquid, a gas, a mixture of a liquid and a gas and/or a hypercritical fluid (of course, a certain fraction of solid particles can be present as well).

More preferred, the cooling system is designed in a way that at least one cooling means comprises at least one fan device and/or at least one gas contacting heat dissipation device. In particular when air (or another gas) is used for cooling purposes, certain temperature fluctuations are normally unavoidable. Therefore, the presently suggested cooling system can be particularly advantageous. Furthermore, such an air cooled system is normally comparatively cheap and easy to implement.

It is furthermore proposed to provide the cooling system with at least one sensor device, preferably with at least one temperature sensor device, at least one clock device and/or at least one data input device, preferably at least one user data input device. This way, certain embodiments of the previously suggested method can be realised particularly well or even realised at all.

BRIEF DESCRIPTION OF THE DRAWINGS

The present invention and its advantages will become more apparent, when looking at the following description of possible embodiments of the invention, which will be described with reference to the accompanying figures, which are showing.

DETAILED DESCRIPTION

Figure 1:
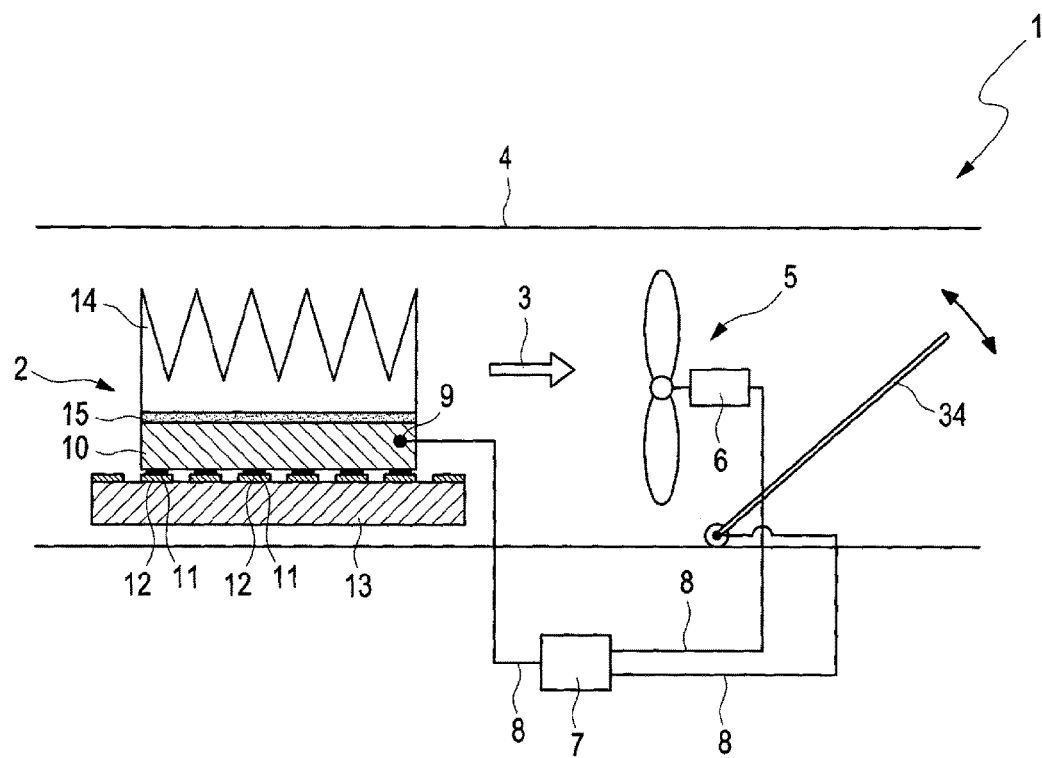
FIG. 1: a possible embodiment of a cooling system in a schematic view.

In FIG. 1, a cooling system 1 for cooling a heat generating device 2—presently a power electronics module 2—is shown in a schematic view.

In the presently depicted embodiment, the cooling is performed with the help of an airstream 3 that is guided through an air channel 4. The airstream 3 is generated by an air fan 5 that is actuated by an electric motor 6. The rotating speed of the air fan 5—and hence the velocity of the airstream 3 and thus the cooling rate of the cooling system 1 (i.e. the extracted heat per unit time), is controlled by an electronic controller 7 that is connected to the electric motor 6 of the air fan 5 through a cable 8. Furthermore, the electronic controller 7 is connected through another cable 8 to a heat sensor 9 that is measuring the actual temperature of the power electronic module 2. Furthermore, a shutter 34 is provided that can be moved by an actuator, which is actuated by the electric controller 7 through a cable 8, as well. If the shutter 34 is in a closed state, an airstream 3 through the air channel 4 will be inhibited. If the shutter 34 is in an open state, an airstream 3 is enabled.

The power electronics module 2 in the current embodiment is a ball grid array chip 10 that is electrically and mechanically connected through several soldered joints 11 to a circuit pattern 12 that is provided on a substrate 13. Furthermore, the ball grid array 10 is provided with a heat sink 14. The heat sink 14 of this embodiment is designed as a standard heat sink 14 with an enlarged surface area, as it is commercially available for electronic devices. To improve the heat conductivity between the ball grid array 10 and the heat sink 14, commercially available heat conductivity paste 15 is used in addition.

In the current embodiment, a power electronics module formed as ball grid array chip is used. It should be emphasised that other technologies for the construction of power electronics modules are also known. For example, when the switching of higher powers is required (such as with the switching of several hundred amps) other bonding technologies such as sintering may be used in one or more of the interfaces in the thermal path within the power electronics module. Such a construction, comprising a number of interfaces, may be severely affected by temperature variation. As an indicator hereof, the thermal and load cycling characteristics of such modules are amongst the most important parameters when selecting devices. A further indication of the importance of this is that for applications subject to great variations in power dissipation in service, a special construction using a metal matrix composite based baseplate (such as AlSiC, for example), rather than the cheaper copper baseplate, may be used despite the fact that the special construction may be substantially more expensive than the copper alternative.

Of course, the ball grid array 10 is always cooled to a certain extent through the substrate 13, as well as through the heat sink 14 (as well as through the uncovered sidewalls of the ball grid array 10). However, if an airstream 3 is present, the cooling capacity will be significantly increased. To save space and money when providing the cooling system 1 for the power electronics module 2, the cooling system 1 is dimensioned in a way that is able to safely remove the mean thermal energy generated by the power electronics module 2. However, it is not dimensioned in a way that it is able to remove the thermal energy that is generated by the power electronic module 2 when it runs at full capacity. In other words, if the power electronic module 2 is run at full capacity, the generated waste heat is only partially removed by the airstream 3 and hence the power electronics module 2 will heat up to a higher temperature above ambient than it would when running at less than full capacity. Thus the temperature of the power electronics module 2 will always rise with rising power dissipation. Any cooling effect, on the other hand, will increases dramatically with the temperature difference between the ambient temperature (or the temperature of the cooling media) and the power electronics module 2.

Figure 2:
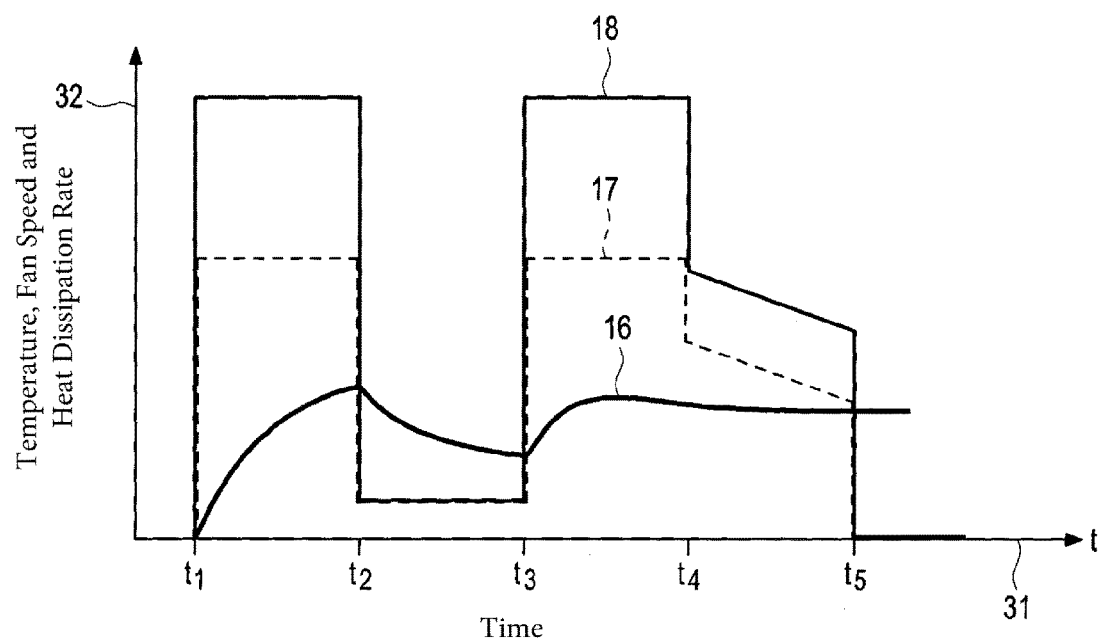
FIG. 2: an example on how to perform a method of cooling a heat generating device.

In FIG. 2, a possible way of actuating the air fan 5 is depicted. The graphs of FIG. 2 show a possible actuation cycle of the power electronics module 2 and hence of the waste heat generated by the power electronics module 2. In FIG. 2, the temperature 16 of the power electronic module 2, the fan speed 17 of the air fan 5 and the heat dissipation rate 18 are shown along the ordinate 32 in dependence of the evolving time t that is depicted along the abscissa 31. Although reference is made to the components shown in FIG. 1, it has to be understood that the presently shown embodiment can be used for other arrangements as well (and vice versa).

As can be seen, if the ball grid array 10 is operated at a high power state (beginning at $t_1$ in FIG. 2), the temperature of the ball grid array 10 (as measured by the heat sensor 9) increases (temperature line 16). Since the electronic controller 7 notices an increase in temperature 16, it is automatically actuating the air fan 5 to run at maximum speed 17 and is actuating the actuator of the shutter 34 to move the shutter 34 into its open position. This way, a temperature change can be avoided to the maximum extent possible (once again, due to the limited dimension of the air fan 5, a temperature increase 16 cannot be avoided under all operating conditions of the power electronics module 2). Accordingly, the heat dissipation rate 18 is correspondingly high (and will increase slightly due to the increasing temperature difference between the heat sink 14 and the temperature of the "fresh air" supplied by the airstream 3. At the point in time $t_2$, the ball grid array 10 is operated in a mode that is generating significantly less waste heat (although it is not yet zero). Now, the electronic controller 7 will actuate the air fan 5 with a significantly lowered current, so that the fan speed 17 will decrease significantly. Therefore, the heat dissipation rate 18 will drop as well. The fan speed 17 and the heat dissipation rate 18 are chosen in a way that a good compromise between low temperatures and a small rate of change of temperature is made. As already discussed, high temperatures will cause a wear of the ball grid array 10 due to an increase in the chemical reaction speed inside the ball grid array 10. On the other hand, a change of temperature will put a mechanical load on the ball grid array 10, the soldered joints 11 and the circuit pattern 12/the substrate 13 due to different thermal expansion coefficients and/or thermal conductivity rates of the components involved, in particular if the rate of change of temperature is comparatively high. Hence, according to the proposed embodiment, the temperature 16 of the ball grid array 10 drops slower as it would be possible by the dimension of the cooling system 1.

At $t_3$, the ball grid array 10 is once again operated at high power, and hence a significant load of waste heat is generated. Therefore, the temperature 16 of the power electronics module 2 rises again and therefore the fan speed 17 is set to maximum speed, setting the heat dissipation rate 18 to maximum rate as well.

Starting at $t_4$, the load of the ball grid array 10 is slowly reduced and hence the waste heat generated decreases. Likewise, the fan speed 17 will be slowly decreased between $t_4$ and $t_5$ (after a stepwise decrease of the fan speed 17 right at $t_4$), and the heat dissipation rate 18 will follow accordingly.

At $t_5$, the ball grid array 10 is completely switched off. This information is also passed to the electronic controller 7. Since no waste heat is expected to be generated in the near future, the electronic controller 7 will switch off the air fan 5 completely. Additionally, the shutter 34 will be closed, to avoid a movement of the air on its own motion (in particular due to a chimney effect). Nevertheless, a slight heat dissipation rate 18 will persist even after $t_5$, since thermal heat conductivity effects are still present. Nevertheless, the heat dissipation rate 18 is very small and hence the temperature 16 drops very slowly.

The temperature on which the rate of change of temperature is based may be based on an actual physical measurement of the temperature of the heat generating device (by, for example the use of a temperature measuring device placed on or near the heat generating device) or by, for example, modelling the temperature change in the system and thus calculating the temperature of the heat generating device based on other parameters such as the current through one or more devices, the time, one or more power measurements, the ambient temperature, the cooling rate etc.

Since failure often occurs due to cyclic stresses at particular interfaces in the thermal path within a particular heat generating device, it is an advantage to reduce stresses from thermal variation at specific (critical) interfaces and it is thus an advantage to measure or calculate the temperatures or temperature variations at those interfaces. In many cases this is simply not possible to measure directly, since such interfaces are inaccessible. However, in a further embodiment, the method used to derive the temperature at a specific interface is to measure the temperature, or other parameters, at one location, and from that measurement combined with the operating state of the device and a thermal model of the interface structure of the device, the temperature (or variation of temperature) of the interface of interest through computation is derived. Thus, in this embodiment, the internal structures of the heat generating device may be thermally modelled so that from measurements of temperature at one point, the rate of change of temperature of a critical interface may be calculated. Any number of measurements can be added to increase accuracy of the calculated temperature.

In alternative embodiments, there may be several interfaces within one or more heat generating devices which are cooled by the same cooling system, and separate derivations may be made for each of these. An algorithm may be developed which chooses the most critical interface (from a reliability perspective) and control the rate of cooling based on this.

Figure 3:
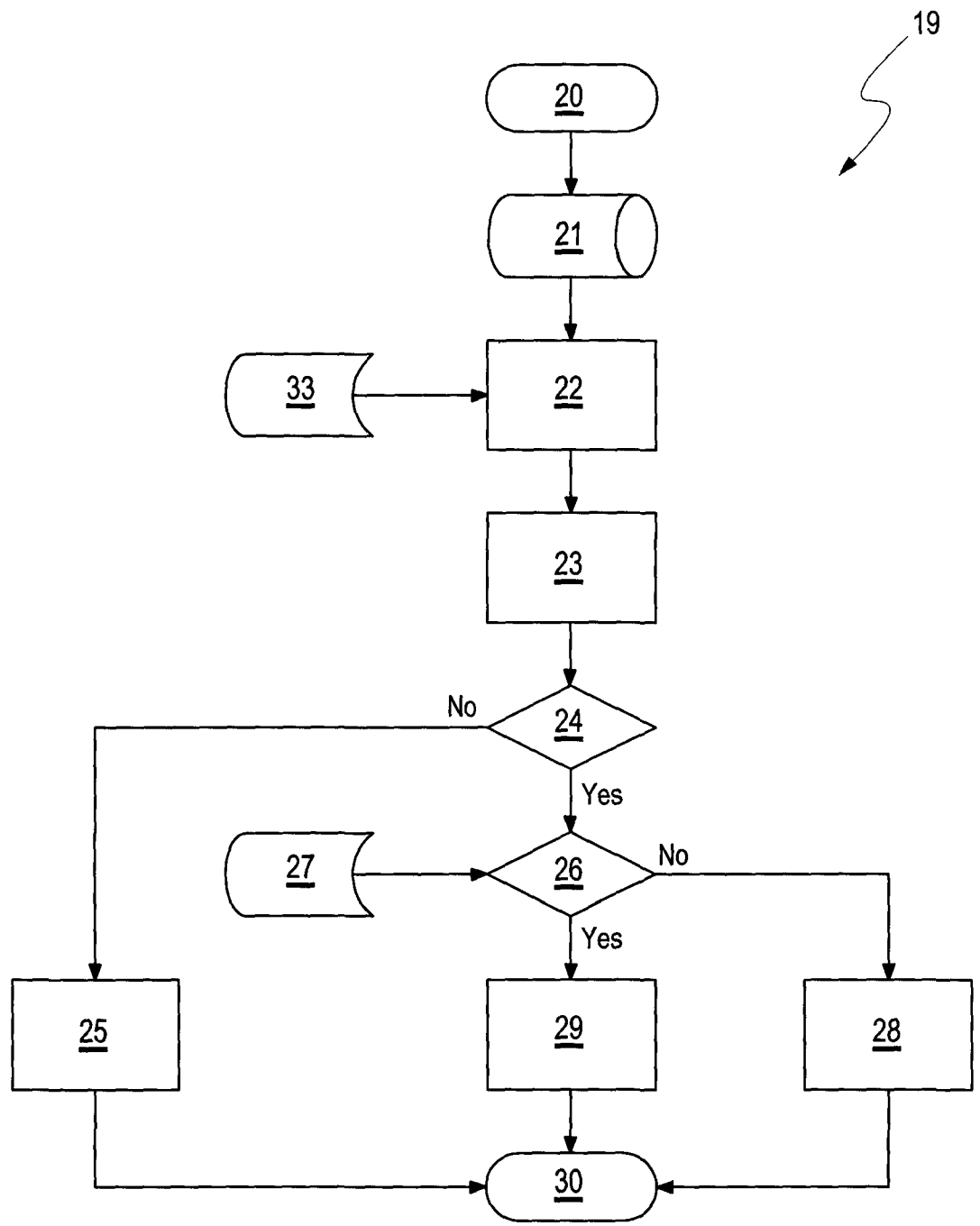
FIG. 3: an embodiment of a method of cooling a heat generating device in a schematic flowchart.

In FIG. 3, a flowchart 19 showing a possible embodiment of a cooling method is depicted. The algorithm starts at step 20. In the beginning, the temperature of the heat generating device is measured 21. In the next step 22, the difference between the previously stored temperature and the presently measured temperature is determined. Together with the time between those two measurements, the rate of change of temperature can be determined 22. If no previously stored measurement value is present, a "dummy value" is provided through function 33. For example, the "dummy value" of the temperature could be 99° C.

After having calculated the rate of change of temperature in step 22, the new temperature is stored at step 23. Now, it is determined at step 24 whether the temperature difference is larger than zero or not. If the temperature is increasing, the algorithm jumps to step 25, where the air fan 5 is operated at full power. If, on the other hand, the temperature difference is smaller than zero (i.e. the temperature is falling), it is determined 26 whether the temperature change rate is above or below a previously determined desired value, or not. Once again, a "dummy value" is provided in step 27, if the algorithm is initialised. As an example, as a "dummy value" a temperature change rate of 1° C. per minute or 1° C. per hour could be set.

Based on the comparison at step 26, the fan power is increased 28, if the rate of change of temperature is smaller than the desired value. If, however, the rate of change of temperature is larger than the desired value, the fan power is reduced 29. Now, the present cycle of the algorithm has ended (step 30) and the algorithm will start again at step 20.

Although various embodiments of the present invention have been described and shown, the invention is not restricted thereto, but may also be embodied in other ways within the scope of the subject-matter defined in the following claims.

What is claimed is:

1. A method of cooling a heat generating device, comprising the steps of:
    cooling the heat generating device with a cooling device,
    determining the temperature of the heat generating device and a rate of change of the temperature of the heat generating device during the cooling, and
    regulating the cooling capacity of the cooling device so as to limit the rate of change of the temperature of the heat generating device to a predetermined limiting value when the temperature of the heat generating device is within a predetermined temperature range.

2. The method according to claim 1, wherein the predetermined limiting value varies with the temperature of the heat generating device.

3. The method according to claim 1, wherein the cooling capacity of the cooling device is increased if either the temperature of the heat generating device increases or the temperature is above an upper limit of the predetermined temperature range.

4. The method according to claim 1, wherein the cooling capacity of the cooling device is kept at a constant level when the temperature of the heat generating device is within the predetermined temperature range.

5. The method according to claim 1, wherein the predetermined limiting value is set according to at least one of the following factors:
    a previous history of the temperature of the heat generating device,
    an expected future heat generation rate of the heat generating device,
    an actual time,
    a system specific setting, and
    a user input setting.

6. The method according to claim 1, wherein the temperature of the heat generating device comprises an estimated temperature of a particular thermal interface within the heat generating device.

7. The method according to claim 1, wherein the cooling capacity of the cooling device is regulated to be zero if the temperature is below a lower limit of the predetermined temperature range.

8. The method according to claim 7, wherein the cooling capacity of the cooling device is regulated to be zero by either operating at least one cooling inhibiting device or operating the cooling device at a cooling inhibiting mode.

9. The method according to claim 7, wherein the cooling capacity of the cooling device is regulated to be zero by closing a shutter.

10. The method according to claim 1, further comprising heating the heat generating device if the temperature is below a lower limit of the predetermined temperature range.

11. The method according to claim 1, wherein the heat generating device is a ball grid array chip.

12. The method according to claim 11, wherein the cooling device is an air fan.

* * * * *